United States Patent [19]

Kimura et al.

[11] Patent Number: 5,016,223
[45] Date of Patent: May 14, 1991

[54] MEMORY CARD CIRCUIT

[75] Inventors: Masatoshi Kimura; Kohichi Hayamizu, both of Itami, Japan

[73] Assignee: Mitsubishi Denki Kabushiki Kaisha, Tokyo, Japan

[21] Appl. No.: 509,780

[22] Filed: Apr. 17, 1990

[51] Int. Cl.[5] ............................................. G11C 5/14
[52] U.S. Cl. ..................................... 365/229; 365/52; 365/189.05; 365/226
[58] Field of Search .................... 365/52, 189.05, 226, 365/229

[56] References Cited

U.S. PATENT DOCUMENTS

| | | | |
|---|---|---|---|
| 4,587,640 | 5/1986 | Saitoh | 365/229 |
| 4,654,829 | 3/1987 | Jiang et al. | 365/229 |
| 4,677,593 | 6/1987 | Davis | 365/229 |
| 4,831,595 | 5/1989 | Bone | 365/229 |
| 4,858,196 | 8/1989 | Hein | 365/229 |

*Primary Examiner*—James W. Moffitt
*Attorney, Agent, or Firm*—Leydig, Voit & Mayer

[57] ABSTRACT

A memory card circuit for a portable memory card includes a unidirectional non-inverting buffer with an analog switch connected to an input terminal of a semiconductor memory and a bidirectional 3-state buffer with an analog switch connected to an input/output terminal of the memory card. An analog switch connected is series to a terminal signal of the semiconductor memory and a second analog switch connected in parallel to ground in parallel interfaces the card to a terminal unit. A transistor connected in series between a power supply input from the terminal unit and an internal power supply of the memory card, a supply voltage detecting circuit having inputs of a card insertion and extraction signal and a supply voltage of the memory card produces an output signal for turning ON or OFF the series transistor, the unidirectional non-inverting buffer with the analog switch and the bidirectional 3-state buffer with the analog switch.

6 Claims, 7 Drawing Sheets

F I G .6.
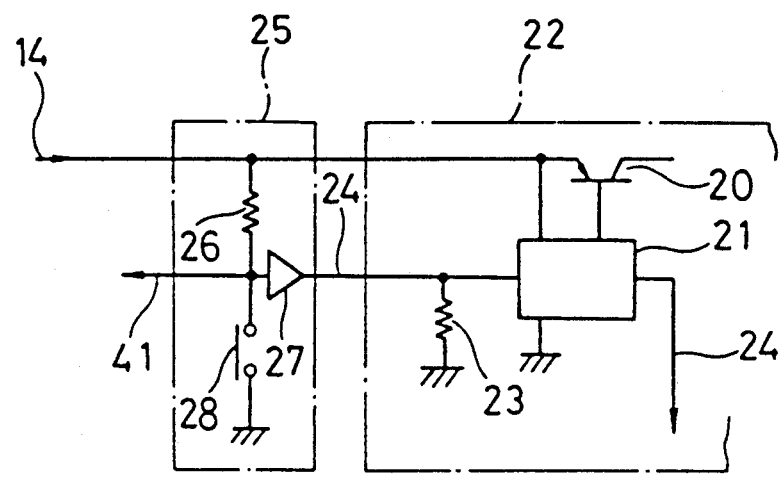
F I G .7.
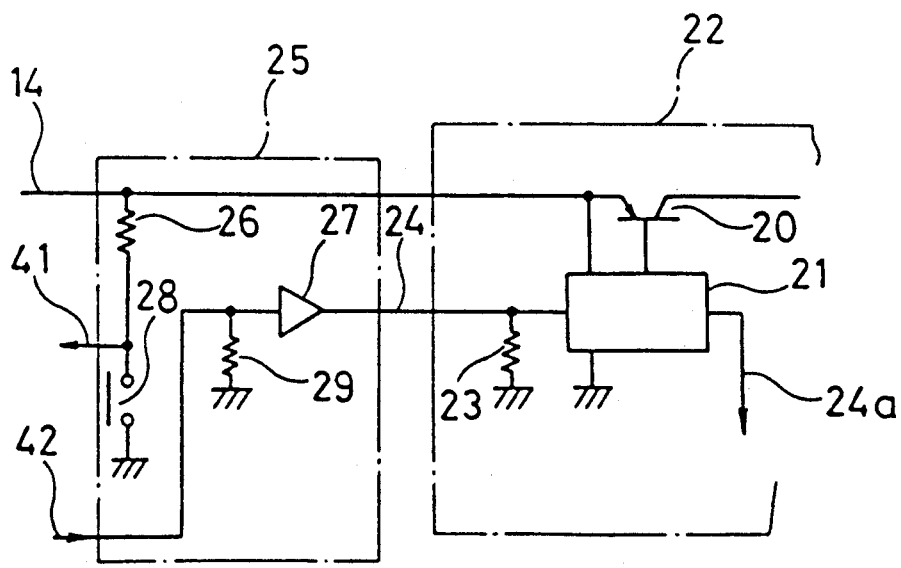

MEMORY CARD CIRCUIT

FIELD OF THE INVENTION

The present invention relates to a memory card circuit and, more particularly, to a circuit of a portable memory card in which an external memory device is replaced by a semiconductor memory to use its characteristics of high speed, low power consumption and no noise.

BACKGROUND OF THE INVENTION

FIG. 8 shows a conventional memory card circuit. In FIG. 8, reference numeral 1 designates a static RAM group, which comprises a plurality of static RAM's 2. Reference numeral 3 designates an address decoder circuit, which generates a static RAM selecting signal 13 for selecting each static RAM 2 from the static RAM group 1 by means of an address bus signal 8 and a chip enable signal 9. The static RAM group 1 is connected to a well-known chip enable signal ($\overline{CE}$) 9, a write enable signal ($\overline{WE}$) 10, an output enable signal ($\overline{OE}$) 11 and a data bus signal 12. Reference numeral 14 designates a power supply input serving as an internal power supply 15 through a series diode 16. When the power supply input 14 is OFF or when a card is carried, a battery 6 supplies a current as the internal power supply 15 through a series resistor 5, for controlling the amount of current, and a protecting diode 4, for preventing reverse electric current flow, to save stored data in RAM 2. Reference numeral 7 designates an equivalent load capacitor and reference numeral 17 designates a pull-up resistor. In addition, signals $\overline{E}$, $\overline{CE}$, $\overline{WE}$, and $\overline{OE}$ are "L" active signals (they are operable at "L" level).

The circuit shown in FIG. 8 is the minimum essential circuit for a memory card circuit, which is generally well-known to one skilled in the art. The address decoder circuit 3 is used in order to select each static RAM 2 from the static RAM group 1. The static RAM selecting signal 13 output from the address decoder 3 is connected to the chip select signal of the corresponding RAM 2. More specifically, this conventional memory card circuit directly outputs each terminal signal of the RAM 2 to the outside. Therefore, the operation of the circuit shown in FIG. 8 is basically the same as that of a single RAM 2.

Operation of this circuit is described hereinafter.

First, operation when there is no power supply input 14 is described. The voltage of the battery 6 is applied to the RAM 2 and the address decoder 3 through the series resistor 5 and the protecting diode 4. In addition, the RAM selecting signal 13 output from the decoder 3 is at "H" level because the resistor 17 of the chip enable signal 9 is pulled up to the internal power supply 15. Therefore, the signal 9 of each RAM 2 attains "H" level, so that the data bus signal 12 of the RAM 2 is floating. As a result, stored data in the RAM 2 can be maintained without any destruction.

Then, operation when the power supply input 14 is applied from the terminal unit is described. The power supply input 14 is input to the internal power supply 15 through the series diode 16. Generally, since a voltage of the internal power supply 15 at this time is larger than that of the battery 6, the internal power supply 15 is cut off from the battery 6 by an action of the protecting diode 4. As a result, current does not flow into the battery and no consumption occurs.

Since reading and writing of the RAM 2 is the same as that for a single RAM, a detailed description thereof is omitted and a brief description is given hereinafter. First, the address bus signal 8 is input to the decoder 3 and the RAM 2 from a terminal unit. Although the decoder 3 decodes the chip enable signal ($\overline{CE}$) 9 of the RAM 2 corresponding to the address bus signal 8, it is actually output only when an input of the chip enable signal 9 of the decoder 3 is at "L" level. Now, it is assumed that a desired RAM 2 is selected by the decoder 3 and the chip enable signal $\overline{CE}$ of the selected RAM 2 is at "L" level. When data from the data bus signal 12 is written in a memory area of the RAM 2, the write enable signal ($\overline{WE}$) 10 is set at "L" level while the signal $\overline{CE}$ is at "L" level. At this time, the output enable signal ($\overline{OE}$) 11 is at "H" level. In addition, when data is read from the memory area of the RAM 2, the signal 11 is set at "L" level while the signal $\overline{CE}$ is at "L" level. At this time, the signal 10 is at "H" level. In addition, when the signal 9 is set at "H" level, the data bus signal 12 of the RAM 2 becomes floating, whereby reading or writing operation can not be performed. These operations are the same as that for a single RAM, which is well-known to one skilled in the art.

There are following problems in the conventional memory card circuit. That is,

1) The terminal signal of each RAM 2 is directly exposed (output) to the outside and when the memory card is inserted or extracted while the terminal unit is operating (the power supply input 14 is applied), the signal level becomes unstable at the connecting means between the memory card and the terminal unit (signals do not change at the same level, so that there is a short time difference at the moment that the card is inserted or extracted), causing the stored data in the RAM 2 to be destroyed.

2) When the terminal unit and the memory card are connected, if the power supply input 14 is turned OFF and the chip enable signal 9 and the write enable signal 10 are at "L" level on the side of the terminal unit, a current from the battery 6 flows into the terminal unit through the series resistor 5, the protecting diode 4 and the pull-up resistor 17, with the result that the battery 6 is discharged and consumed in a moment.

3) Since each terminal signal of the RAM 2 is basically output to the outside, resistance to static electricity of the memory card depends on the resistance to static electricity of each RAM 2.

4) The input/output impedance of the memory card when the card is carried depends on the impedance of each RAM 2 and the address decoder circuit 3, which is generally a considerably high impedance, so that resistance to static electricity or an electromagnetic field is low.

5) When the number of RAMs 2 is increased, input-/output capacity of each of the signals 9 to 12 is increased, so that rising and falling time of each signal is increased and a standard value for all the RAMs 2 is not achieved, with the result that electrical performance is considerably degraded.

SUMMARY OF THE INVENTION

The present invention was made in order to solve those problems and it is an object of the present invention to provide a memory card circuit with large capacity and high reliability in which even if the memory card is directly extracted or inserted when the terminal unit and the memory card are connected in an active state (conductive state) preservation of, stored data of a semiconductor memory such as a RAM is assured and a battery current from the memory card does not flow to the outside and resistance to static electricity or an electromagnetic field is high.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A memory card circuit in accordance with the present invention comprises a unidirectional non-inventing buffer with an analog switch connected to an input terminal of a semiconductor memory and a bidirectional 3-state buffer with an analog switch connected to an input/output terminal, each of which has an analog switch connected in series to a terminal signal of the semiconductor memory and connected in parallel to ground so that the semiconductor memory interfaces with the terminal unit; a series transistor connected between a power supply input and an internal power supply of a memory card; and a supply voltage detecting circuit to which an insertion and extraction signal of the card and a supply voltage are input, an output signal of which turns On or OFF the series transistor, the unidirectional non-inverting buffer with the analog switch and the bidirectional 3-state buffer with the analog switch. The card insertion and extraction signal is generated from a card insertion and extraction signal generator within a terminal, a card insertion and extraction switch provided inside the memory card or the shortest contact of connecting parts between the terminal unit and the memory card.

As described above, the memory card circuit in accordance with the present invention comprises the unidirectional non-inverting buffer with an analog switch for an address bus signal and signals CE, WE and OE serving as input signals of the semiconductor memory and the bidirectional 3-state buffer with an analog switch for the input and output signal. As a result, each terminal signal of the semiconductor memory of the memory card is prevented from being directly exposed to the outside and even if a plurality of semiconductor memories are packaged, the same electrical performance as that of one semiconductor memory can be attained.

In addition, the memory card circuit in accordance with the present invention comprises analog switches of the unidirectional and bidirectional buffers connected in series to the terminal signals of the semiconductor memory and also connected in parallel to ground, the series transistor provided between the power supply input and the internal power supply, and also the supply voltage detecting circuit having an input for the card insertion and extraction signal generated from the card insertion and extraction signal generator provided on the terminal unit side or the card insertion and an extraction switch provided inside the memory card or the shortest contact of the connecting parts between the terminal unit and the memory card, and an input of a supply voltage. Since the series transistor and the unidirectional and bidirectional buffers are turned ON or OFF by an output signal of the supply voltage detecting circuit, even if the card is inserted or extracted when the terminal unit is in the active state, stored data is prevented from being destroyed and all of the terminal signals of the semiconductor memory are reliably cut off from the terminal unit and are the low impedance state at the moment the card is inserted or extracted. As a result, resistance to static electricity or an electromagnetic field is improved and resistance to a noise can be also considerably improved. In addition, the resistance to noise when the card is carried is remarkably improved. Furthermore, it is possible to prevent a battery current from flowing into the terminal unit when there is no power supply input.

BRIEF DESCRIPTION OF THE DRAWINGS

FIGS. 6 and 7 are diagrams each showing an example of a card insertion and extraction signal generator of a terminal unit for the embodiment of the invention shown in FIG. 1.

DETAILED DESCRIPTION OF PREFERRED EMBODIMENTS

An embodiment of the present invention will be described in detail with reference to the drawings.

Figure 1:
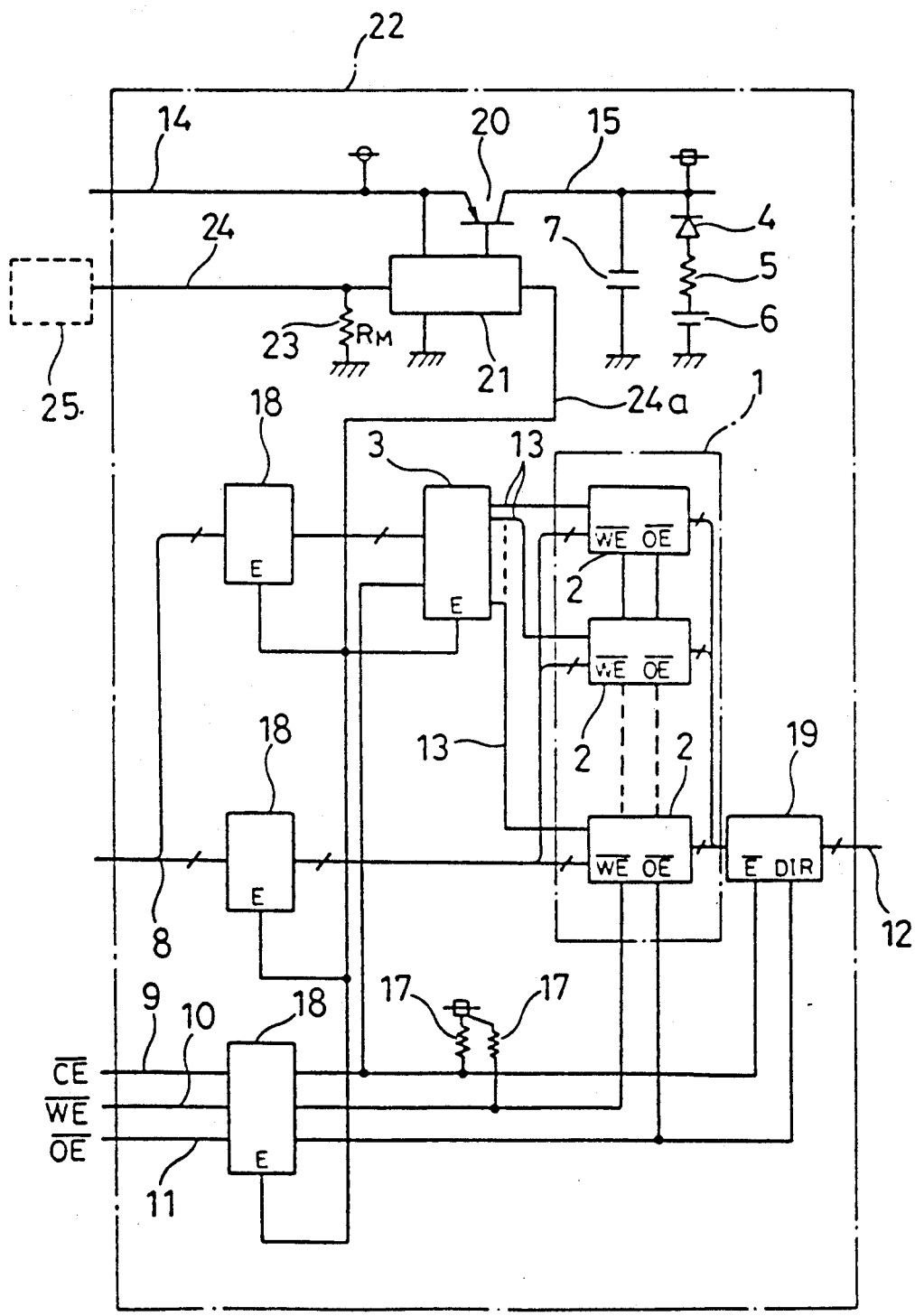
FIG. 1 is a diagram showing a memory card circuit in accordance with a first embodiment of the present invention.
Figure 8:
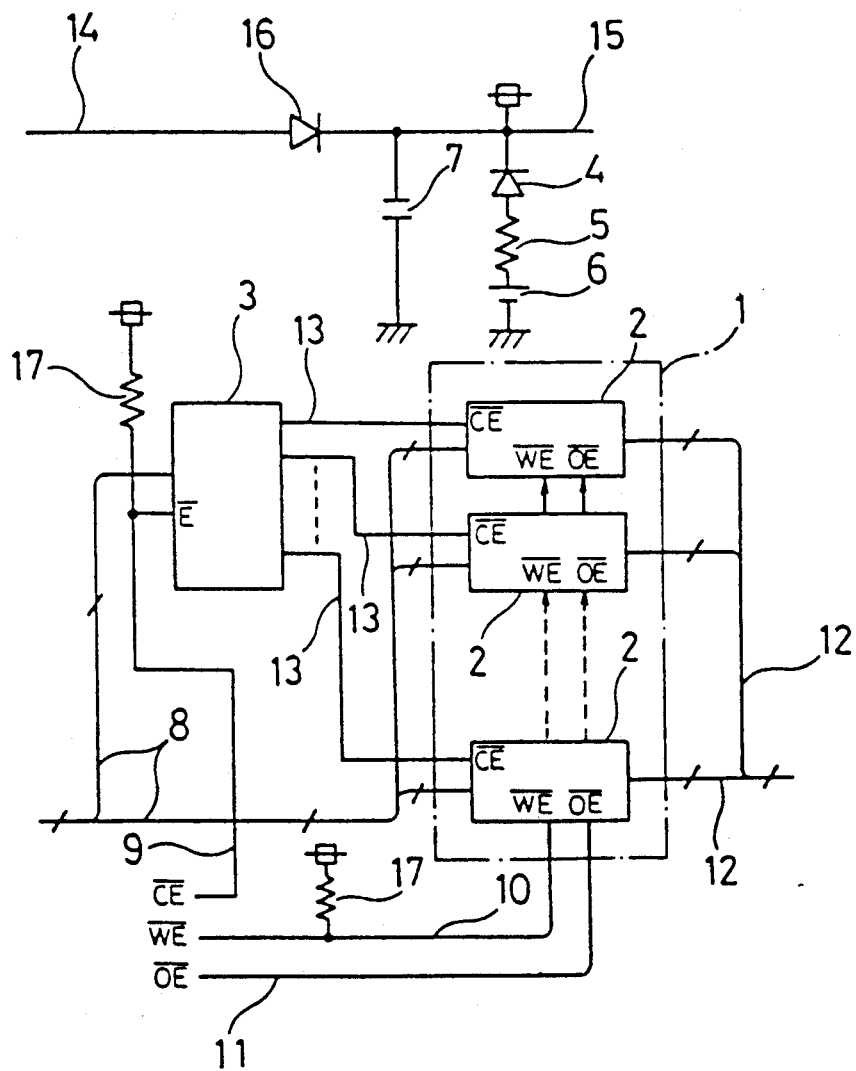
FIG. 8 is a diagram showing a conventional memory card circuit.

FIG. 1 shows a memory card circuit in accordance with a first embodiment of the present invention. In FIG. 1, reference numerals 1 through 17 designate the same elements as in FIG. 8. In order not to directly expose all terminal signals of a RAM 2 to the outside, each RAM 2 is connected to the outside through a unidirectional non-inverting buffer 18 with an analog switch and a bidirectional 3-state buffer 19 with an analog switch. A series transistor 20 and a supply voltage detecting circuit 21 are provided between an external power supply input 14 from a terminal unit and an internal power supply 15 of a memory card 22. A pull-down resistor ($R_M$) 23 is set at the grounding level, that is, "L" level when the memory card 22 is carried. A card insertion and extraction signal 24 is input to operate the detecting circuit 21. When the card insertion and extraction signal 24 is at "H" level, the detecting circuit 21 becomes operable and when the voltage of the power supply input 14 attains a predetermined value or more, the transistor 20 becomes conductive. At the same time, a connection/off signal 24a of the detecting circuit 21 attains "H" level, so that the buffers 18 and 19 are turned ON (connecting state). When the voltage of the power supply input 14 becomes less than the predetermined value, the transistor 20 is turned OFF (non-connecting state) and at the same time, the buffers 18 and 19 are turned OFF (non-connecting state). When the card insertion and extraction signal 24 is at "L" level, the transistor 20, the buffers 18 and 19 are unconditionally OFF. Reference numeral 25 designates a card insertion and extraction signal generator provided within the terminal unit.

Figure 4A:
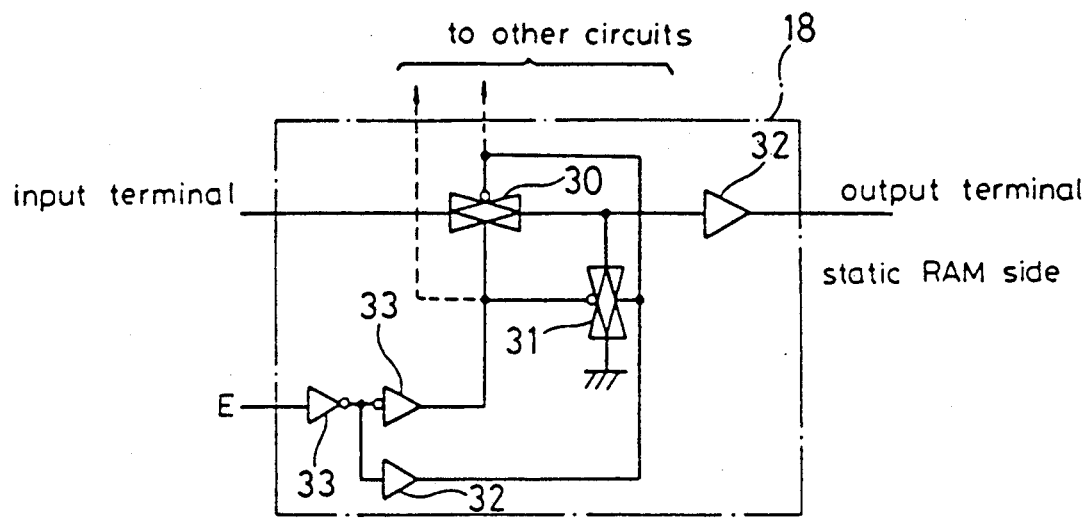
FIG. 4(a) is a diagram showing a circuit of a non-inverter buffer with an analog switch.
Figure 4B:
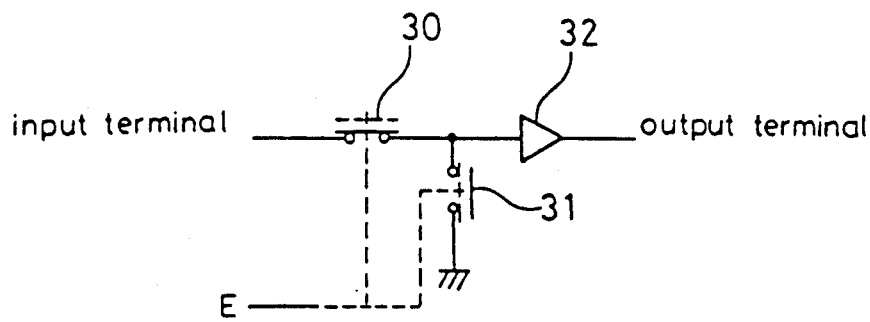
FIG. 4(b) is a diagram showing the equivalent circuit of the operation of the non-inverter buffer.
Figure 5A:
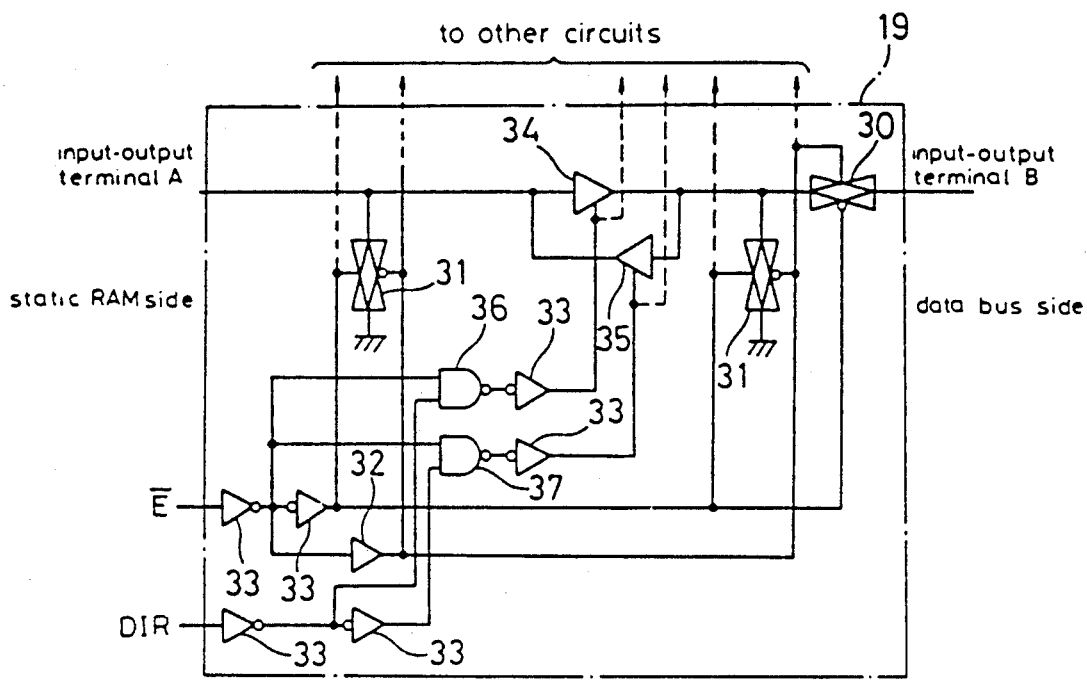
FIG. 5(a) is a diagram showing an inside circuit of a 3-state buffer with an analog switch.
Figure 5B:
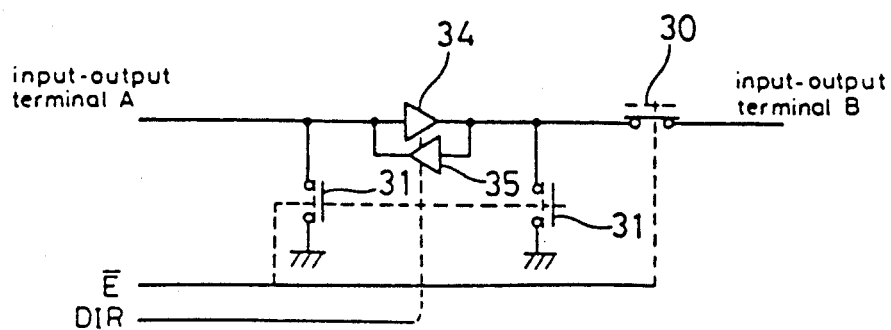
FIG. 5(b) is a diagram showing the equivalent circuit of the operation of the 3-state buffer is described.

FIG. 4(a) is a circuit diagram showing the unidirectional non-inverting buffer 18 with an analog switch and FIG. 4(b) is a diagram showing the equivalent circuit by which operation of the non-inverting buffer 18 is described. FIG. 5(a) is a circuit diagram showing the bidirectional 3-state buffer 19 with an analog switch and FIG. 5(b) is a diagram showing the equivalent circuit by which operation of the 3-state buffer 19 is described. In these figures, reference numeral 30 designates an analog switch for controlling a signal, which is connected to all of the terminal signals of the static RAM in series. Reference numeral 31 designates a protecting analog switch connected to the ground. Reference numeral 32 designates a non-inverting buffer, reference numeral 33 designates an inverting buffer, reference numeral 34 designates a 3-state buffer A, reference numeral 35 designates a 3-state buffer B, reference numeral 36 designates a NAND circuit A, and reference numeral 37 designates a NAND circuit B. Although the buffers 18 and 19 shown in FIGS. 4(a) and 5(a) generally comprise N gate circuits, a diagram of an internal circuit for only one gate is shown here. Operation of each of the buffers 18 and 19 is shown in the following truth value tables 1 and 2.

TABLE 1

| E | Truth Value 30 | 31 |
|---|---|---|
| "H" | ON | OFF |
| "L" | OFF | ON |

TABLE 2

| $\overline{E}$ | DIR | Truth Value 30 | 31 | 34 | 35 |
|---|---|---|---|---|---|
| "L" | "L" | ON | OFF | ON A → B | Z |
| "L" | "H" | ON | OFF | Z | ON B → A |
| "H" | X | OFF | ON | Z | Z |

FIGS. 6 and 7 each show an example of the card insertion and extraction signal generator 25 provided within a terminal unit. In FIGS. 6 and 7, reference numeral 26 designates a pull-up resistor, reference numeral 27 designates a non-inverter buffer, reference numeral 28 designates a card insertion and extraction switch which is closed, that is, "L" level only when the card is inserted or extracted. In addition, a signal 41 is connected to an interrupt port or an I/O port of a CPU of the terminal unit and a signal 42 is an I/O port control input from the CPU, which attains "L" level when the card is inserted or extracted.

Next, a description is given of operation of each part of the memory card in accordance with the present invention. First, operation of the buffers 18 and 19 is described with reference to FIGS. 4 and 5 and the truth value tables 1 and 2.

As shown in FIG. 4(b), the analog switch 30 and the non-inverting buffer 32 are connected in series between the input terminal and the output terminal, and the analog switch 31 is connected to ground and the input side of the buffer 32. As shown in the truth value table 1, when the E terminal is at "H" level, the switch 30 is ON (connection) and the switch 31 is OFF (non-connection). When the E terminal is at "L" level, the switch 30 is OFF (non-connection) and the switch 31 is ON (connection). More specifically, according to FIG. 4(a), when the E terminal attains "H" level, the switch 30 is turned ON (connection) and the switch 31 is turned OFF (non-connection) through the buffers 32 and 33, whereby the input terminal and the output terminal is connected and a signal can be transferred. When the E terminal attains "L" level, the switch 30 is turned OFF (non-connection) and the switch 31 is turned ON (connection) through the buffers 32 and 33, whereby the input terminal and the output terminal are disconnected and then a signal can not be transferred. In this case, although interface between the terminal unit and the memory card are disconnected, since the switch 31 is turned ON (connection) and it is set at a resistance value of several 10Ω to several 100Ω, it attains "L" level. Therefore, the input terminal of the RAM 2 attains "L" level through the buffer 32 and becomes the low impedance state.

Then, operation of the buffer 19 is described hereinafter.

As shown in FIG. 5 and the truth value table 2, when the $\overline{E}$ terminal is at "L" level, the switch 30 is ON (connection) and the switch 31 is OFF (non-connection). When the $\overline{E}$ terminal is at "H" level, the switch 30 is OFF (non-connection) and the switch 31 is ON (connection). When a DIR terminal is at "L" level under the condition that the $\overline{E}$ terminal is at "L" level, the buffer 34 is ON (connection), whereby the signal can be transferred from the input/output terminal A to the input/output terminal B. At this time, however, the signal can not be transferred in the reverse direction, that is, from the input/output terminal B to the input/output terminal A. When the DIR terminal is at "H" level, the buffer 35 is ON (connection), whereby the signal can be transferred from the input/output terminal B to the input/output terminal A. At this time, however, the signal can not be transferred in a reverse direction, that is, from the input/output terminal A to the input/output terminal B. As can be seen from the truth value table 2, although an ON/OFF state of the switches 30 and 31 is determined by the $\overline{E}$ terminal, the DIR terminal is effective when the $\overline{E}$ terminal is at "L" level. Now, when the $\overline{E}$ terminal is set at "L" level and the DIR terminal is set at "L" level, the buffer 34 is turned ON (connection) and the buffer 35 becomes Z (non-connection) through the buffer 33 and the NAND circuits 36 and 37. In addition, when the $\overline{E}$ terminal is set at "L" level and the DIR terminal is set at "H" level, the buffer 34 becomes Z (non-connection) and the buffer 35 is turned ON (connection) through the buffer 33 and the NAND circuits 36 and 37.

Thus, it is found that when the E terminal of the buffer 18 and the $\overline{E}$ terminal of the buffer 19 are disabled, the switch 30 is turned OFF (non-connection) and the switch 31 is turned ON (connection), whereby the interface between the terminal unit and the memory card is cut off and the input/output terminal of the RAM 2 is grounded at low impedance.

The operation of each part is described by dividing it into the following four operational modes with reference to FIG. 1.

Operation Mode 1: Operation when the terminal unit and the memory card are in the active state (conductive state).

Operation Mode 2: Operation when the memory card is carried.

Operation Mode 3: Operation when the memory card is inserted into the terminal unit in the active state from the operation mode 2.

Operation Mode 4: Operation when the memory card is extracted from the operation mode 1.

In addition, it is assumed that all of the power supplies of the RAM 2, the decoder 3 and the buffers 18 and 19 which are packaged in the memory card 22 are connected to the internal power supply 15.

First, the operation mode 1 is described hereinafter.

Since the power supply input 14 is applied from the terminal unit and the card insertion and extraction switch 28 of the card insertion and extraction signal generator 25 is OFF (open), the card insertion and extraction signal 24 is at "H" level. Since the card insertion and extraction signal 24 is at "H" level, the supply voltage detecting circuit 21 is in an operable state. When the power supply input 14 becomes a predetermined value or more (when it attains a normal voltage), the detecting circuit 21 starts to operate and turns the series transistor 20 ON (connecting state) and then the power supply input 14 is applied to the internal power supply 15. At the same time, the connection/off signal 24a of the detecting circuit 21 attains "H" level and is applied to the E terminal of the buffer 18, whereby the buffer 18 is enabled. Therefore, according to the truth value table 1, the switch 30 is turned ON and the switch 31 is turned OFF in the buffer 18 and terminal unit and the memory card are connected. In addition, the operation of the buffer 19 is determined by the $\overline{CE}$ and $\overline{OE}$ signals at the input terminal of the buffer 18, which will be described later. Since the voltage of the internal power supply 15 is higher than that of the battery 6, the battery 6 becomes non-connecting because of an action of the protecting diode 4, whereby current does not flow from the battery 6. In this state, reading and writing operation of the RAM 2 is performed by the following procedure. First, when an address bus signal 8 is output from the terminal unit, it is applied to the decoder 3 through the buffer 18. Then, when "L" level is applied to the $\overline{CE}$ terminal, the decoder 3 starts to operate and the RAM selecting signal 13 which selects a RAM 2 having a desired address is produced. Then, the $\overline{E}$ terminal of the buffer 19 is enabled and the data bus signal 12 can be sent or received. When the data bus signal 12 is written in the RAM 2 in this state, the $\overline{OE}$ terminal is set at "H" level and the $\overline{WE}$ terminal is set at "L" level. According to the truth value table 2, when $\overline{E}$ is at "L" level and DIR is at "H" level, the buffer 35 of the buffer 19 is ON (connection), so that the signal of the buffer 19 is transferred from the input/output terminal B to the input/output terminal A. When data is read from the RAM 2 to the signal 12, internal data of the RAM 2 can be read out to the signal 12 when $\overline{WE}$ is set at "H" level and $\overline{OE}$ is set at "L" level. According to the truth value table 2, when the $\overline{E}$ is set at "L" level and DIR is set at "L" level, the buffer 34 is ON (connection), so that the signal of the buffer 19 is transferred from the input/output terminal A to the input/output terminal B.

Next, the operation mode 2 is described hereinafter.

Since the power supply input 14 is not applied from the terminal unit and the pull-down resistor 23 is at the ground, level, the detecting circuit 21 is in a non-operable state and the transistor 20 is OFF (non-connection). Therefore, the battery voltage of the battery 6 is applied to the internal power supply 15 through the series resistor 5 and the diode 4. More specifically, stored data in the RAM 2 is maintained at this time. On the other hand, the E terminal of the buffer 18 is in disabled because the connection/off signal 24a of the detecting circuit 21 is at "L" level. In addition, since the $\overline{CE}$ terminal is OFF through the buffer 18, the $\overline{E}$ terminal of the buffer 19 is pulled up by the resistor 17 and attains "H" level, so that it becomes disabled. Therefore, according to the truth value tables 1 and 2, it can be seen that the switch 30 is turned OFF (non-connection) and the switch 31 is turned ON (connection), and then all of the terminal signals of the RAM 2 become low impedance. As a result, when the memory card is carried, resistance to static electricity or an electromagnetic field can be fairly improved as compared with a RAM 2 simple.

Next, the operation mode 3 is described hereinafter.

When the memory card is inserted into the terminal unit in the active state from the operation mode 2, the card insertion and extraction switch 28 of the card insertion and extraction signal generator 25 is placed in the connecting (closed) state, that is, "L" level, so that the card insertion and extraction signal 24 attains "L" level. More specifically, the card insertion and extraction signal 24 attains "L" level at the moment the memory card 22 is inserted into the terminal unit. That is, the state of the operation mode 2 is maintained when the card is inserted. When the CPU of the terminal unit detects that the card 22 is inserted and the card insertion and extraction switch 28 is turned ON (open), "H" level is output from the card insertion and extraction signal 24. At this moment, the operation mode is moved to the operation mode 1. Therefore, even if the card 22 is inserted at the time the terminal unit is in the active state, no influence of a level change of each terminal signal of the terminal unit generated at a connecting part or a time difference is exerted thereon. More specifically, since the memory card is inserted while all of the terminal signals of the RAM 2 are in the low impedance state, there is no problem if noise is caused by static electricity or an electromagnetic field when the card is inserted. Since operation hereinafter is the same as that of the operation mode 1, it is omitted.

Then, a description is given of operation of the card insertion and extraction signal generator 25 within the terminal unit shown in FIGS. 6 and 7. When the card 22 is inserted or extracted, first, the card insertion and extraction switch 28 is closed, that is, is "L" level. Then, the card insertion and extraction signal 24 attains "L" level and then the transistor 20, buffers 18 and 19 of the card 22 are turned OFF. As a result, the card 22 can be inserted or extracted. FIG. 6 shows an example in which the signal 41 of the card insertion and extraction switch 28 is directly connected to the card insertion and extraction signal 24. FIG. 7 shows an example in which the signal 41 of the card insertion and extraction switch 28 is once detected by the CPU of the terminal unit and then a control signal 42 is applied from the I/O port of the CPU to the card insertion and extraction signal 24 through the inverter buffer 27. In either case, since insertion and extraction of the card can be detected by the CPU of the terminal unit, memory access can be interrupted even when the memory card is accessed. As a result, erroneous reading or writing never happens.

Finally, the operation mode 4 is described hereinafter.

When the memory card is extracted from the operation mode 1, the card insertion and extraction switch 28 of the card insertion and extraction signal generator 25 of the terminal unit is closed that is, is "L" level. More specifically, when the card insertion and extraction switch 28 is turned ON, the card insertion and extraction signal 24 attains "L" level momentarily. Therefore, the detecting circuit 21 becomes non-operable and the transistor 20 is turned OFF (non-connection) and at the same time, the connection/off signal 24a of the detecting circuit 21 attains also "L" level. Then, the E terminal of the buffer 18 attains "L" level and is disabled. In addition, since the buffer 18 is in the disabled state and the $\overline{CE}$ terminal becomes OFF, the $\overline{E}$ terminal of the buffer 19 is pulled up by an action of the resistor 17, attains "H" level and is disabled. This state is the same as that of the operation mode 2. Thereafter, other terminal signals of the terminal unit are separated. At this time, no level change is generated at the connecting part nor any time difference is exerted thereon. In addition, since all of the terminal signals of the RAM 2 are in the low impedance state, no influence from static electricity or an electromagnetic field is exerted thereon, with the result that the card can be extracted without any destruction of stored data of the RAM 2.

As described above, even if the memory card is inserted or extracted when the terminal unit is active, the stored data of the RAM 2 is maintained. In addition, resistance to static electricity or an electromagnetic field is improved when the card is carried.

Figure 2:
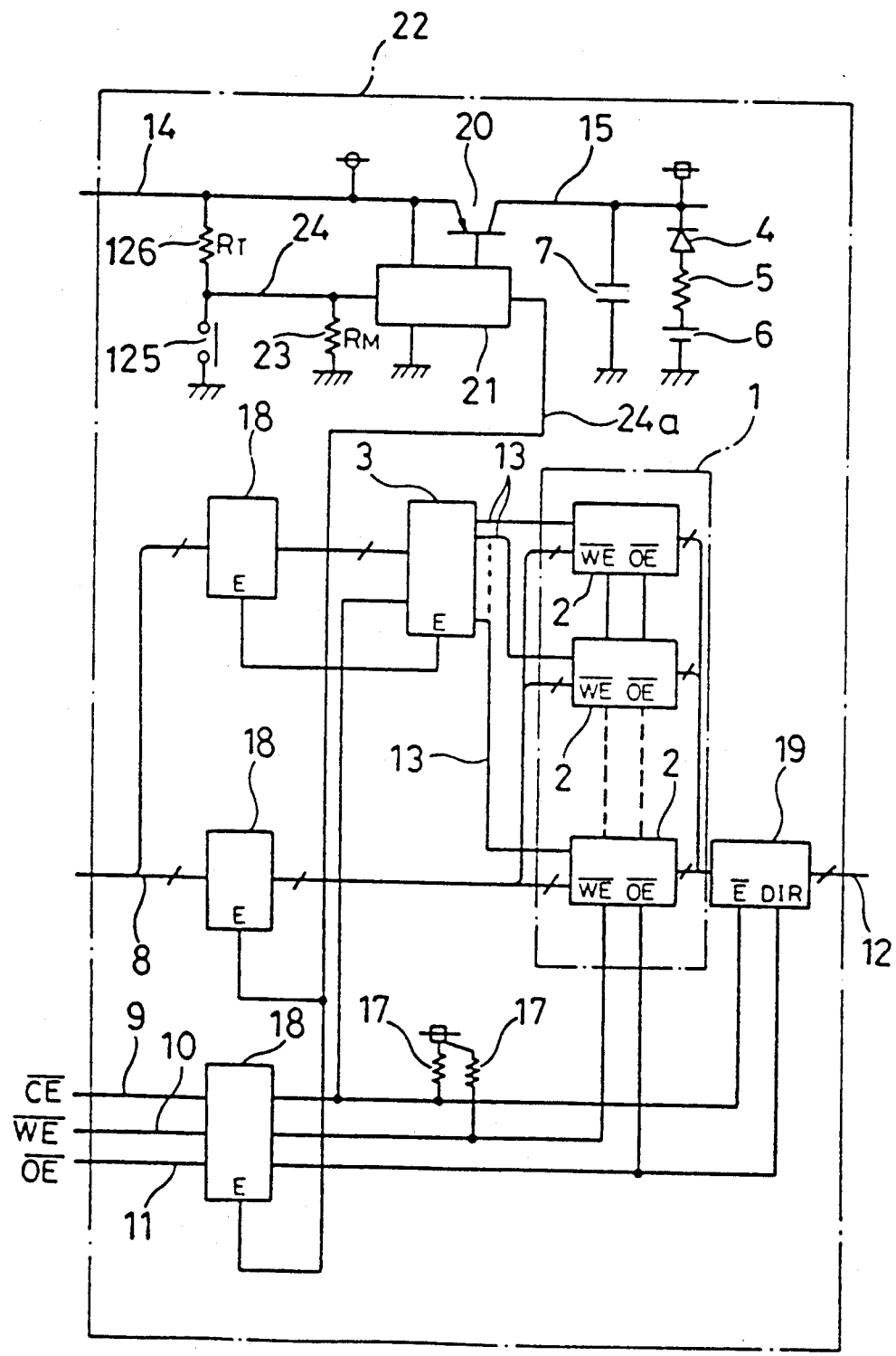
FIG. 2 is a diagram showing a memory card circuit in accordance with a second embodiment of the present invention.

FIG. 2 is a diagram showing a memory card circuit in accordance with a second embodiment of the present invention. In FIG. 2, the same reference numbers as in FIG. 1 designate the same or corresponding parts. Reference numeral 125 designates a card insertion and extraction switch provided inside the memory card 22, which is closed, that is, "L" level when the card 22 is inserted or extracted but normally in an OFF (open) state. Reference numeral 126 designates a dividing resistor ($R_T$). $R_T < R_M$ so that the signal 24 is at "H" level during normal operation.

Operation of each part in accordance with the second embodiment of the present invention is described by dividing it into four operation modes like the first embodiment.

First, the operation mode 1 is described hereinafter.

It is assumed that the card insertion and extraction switch 125 is turned OFF (open) when the power supply input 14 is applied from the terminal unit. Since it $R_T < R_M$, the card insertion and extraction signal 24 is at "H" level, so that the supply voltage detecting circuit 21 is operable at this time. The operation hereinafter is entirely the same as that in the first embodiment.

Since the operation mode 2 is the same as that in the first embodiment, description thereof is omitted.

Then, the operation mode 3 is described hereinafter.

When the card 22 is inserted into the terminal unit in the active state from the operation mode 2, the card insertion and extraction switch 125 of the memory card 22 is closed, that is, is "L" level. Then, the card insertion and extraction signal attains "L" level and the buffers 18 and 19 are in the disabled state while the transistor 20 is still OFF and the connection/off signal 24a from the detecting circuit 21 is still at "L" level. More specifically, the operation mode 2 is still maintained. Then, when the card insertion and extraction switch 125 is turned OFF (open), the card insertion and extraction signal 24 attains "H" level, the detecting circuit 21 starts to operate, the transistor 20 is turned ON (connecting state) and the buffers 18 and 19 become the enable state. At this time, the operation mode is moved to the operation mode 1. Therefore, even if the memory card 22 is inserted when the terminal unit is in the active state, no influence of a level change of the terminal signal of the terminal unit generated at a connecting part or of a time difference is exerted thereon. More specifically, the card 22 is inserted when all of the terminal signals of the RAM 2 are in the low impedance state, so that there is no problem even if noise due to static electricity or an electromagnetic field is generated at that time. Since the operation hereinafter is the same as that of the operation mode 1, description thereof is omitted.

Finally, the operation mode 4 is described hereinafter.

When the memory card is extracted from the operation mode 1, the card insertion and extraction switch 125 of the memory card is closed, that is, is "L" level. More specifically, the card insertion and extraction signal 24 attains "L" level momentarily. Therefore, the detecting circuit 21 becomes non-operable, the transistor 20 is turned OFF (non-connection) and the connection/off signal 24a of the detecting circuit 21 attains "L" level. Thus, the E terminal of the buffer 18 attains "L" level and becomes disabled. In addition, the $\overline{E}$ terminal of the buffer 19 is pulled up, attains "H" level and becomes disabled and the $\overline{CE}$ terminal is OFF. This state is the same as that of the operation mode 2. Thereafter, other terminal signals from the terminal unit are disconnected. At this time, no influence of a level change generated at the connecting part or a time difference is exerted thereon. In addition, since all of the terminal signals of the RAM 2 are in the low impedance state, no influence of static electricity or an electromagnetic field is exerted thereon. As a result, the card 22 can be extracted without any destruction of the stored data of the RAM 2.

As described above, even if the memory card is inserted or extracted when the terminal unit is in the active state, maintenance of the stored data of the RAM 2 is assured. In addition, the resistance to static electricity or an electromagnetic field when the memory card is carried is improved.

Figure 3:
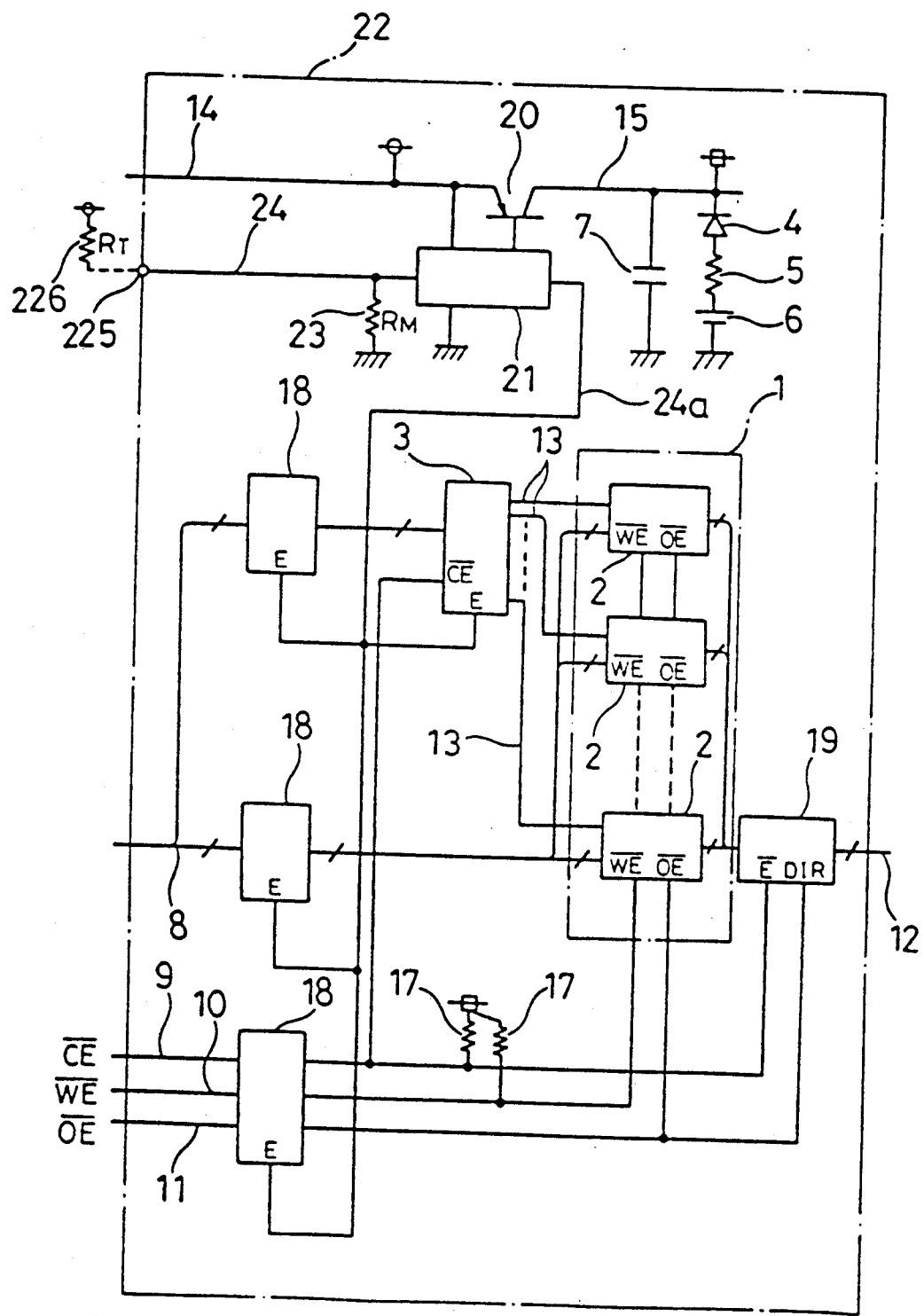
FIG. 3 is a diagram showing a memory card circuit in accordance with a third embodiment of the present invention.

FIG. 3 is a diagram showing a memory card circuit in accordance with a third embodiment of the present invention. In FIG. 3, the same reference numbers as in FIG. 1 designate the same or corresponding parts. Reference numeral 225 designates the shortest pin contact of all of the connecting parts between the terminal unit and the memory card 22, which is connected to the card insertion and extraction signal 24 and to the terminal unit through the pull-up resistor ($R_T$) 226.

Next, operation of each part in accordance with the third embodiment of the present invention is described by dividing it into four operation modes like the first embodiment.

First, the operation mode 1 is described hereinafter.

The card insertion and extraction signal 24 is applied through the pull-up resistor 226 when the power supply input 14 is applied from the terminal unit. Since $R_T < R_M$, the card insertion and extraction signal 24 is at "H" level and the supply voltage detecting circuit 21 is operable. Operation hereinafter is the same as that of the first and second embodiments.

Since the operation mode 2 is the same as that of the first and second embodiments, description thereof is omitted.

Then, the operation mode 3 is described hereinafter.

When the memory card 22 is inserted into the terminal unit in the active state from the operation mode 2, the action of the connecting part 225 of the memory card is effective. More specifically, contacts of the connecting parts other than the short pin contact 225 are connected first at the moment the memory card is inserted into the terminal unit. At this time, since the contact 225 is not yet connected, the operation mode 2 is maintained. Then, the contact 225 is connected and then the card insertion and extraction signal 24 is applied, when the operation mode is moved to the operation mode 1. Therefore, even if the memory card 22 is inserted when the terminal unit is in the active state, no influence of a level change of each terminal signal of the terminal unit generated at the connecting part or a time difference is exerted thereon. More specifically, since all of the terminal signals of the RAM 2 are inserted while they are in a low impedance state, there is no problem even if any noise due to static electricity or an electromagnetic field is generated during card insertion. Since operation hereinafter is the same as that of the operation mode 1, description thereof is omitted.

Finally, the operation mode 4 is described hereinafter.

When the memory card is extracted from the operation mode 1, the connecting part 225 of the memory card is effective. More specifically, since the contact 225 is separated first among the parts connecting to the terminal unit, the card insertion and extraction signal 24 is not applied and then the resistor attains "L" level in a moment. Therefore, the detecting circuit 21 becomes non-operable, the transistor 20 is turned OFF (non-connection) and the connection/off signal 24a of the detecting circuit 21 attains "L" level. Then, the E terminal of buffer 18 attains "L" level and becomes the disabled. In addition, the $\overline{E}$ terminal of the buffer 19 is pulled up and attains "H" level and then becomes disabled by the action of the resistor 17 because the buffer 18 is in the disabled state and the $\overline{CE}$ terminal is OFF. This state is the same as that of the operation mode 2. Thereafter, other terminal signals of the terminal unit are separated. At this time, no influence of a level change generated at the connecting part or of a time difference is exerted thereon. In addition, since all of the terminal signals of the RAM 2 are in the low impedance state, no influence of static electricity or an electromagnetic field is exerted thereon. As a result, the memory card can be extracted without any destruction of the stored data of the RAM 2.

As described above, even if the memory card is inserted or extracted when the terminal unit is in the active state, retention of the stored data of the RAM 2 is assured. In addition, the resistance to static electricity or an electromagnetic field when the card is carried is improved.

Although the semiconductor memory is a static RAM in the first to third embodiments of the present invention, the same effect as in the above embodiments can be obtained even if the semiconductor memory is an OTP (One Time Programmable) ROM, a mask ROM, an EEPROM or the like by removing the battery, the series resistor and the protecting diode.

In addition, the unidirectional non-inverting buffer with an analog switch and the bidirectional 3-state buffer with an analog switch can be constructed with well-known ICs, including in one integrated circuit, and in a gate-array. Furthermore, it is possible to use gate-array circuits comprising a supply voltage detecting circuit by a well-known technique. As a result, costs can be considerably reduced.

As described above, a memory circuit in accordance with the present invention has the following effects, that is, 1) Since all of the terminal signals of the semiconductor memory are connected to the terminal unit through the unidirectional and bidirectional buffers so as not to be exposed to the outside, even if a plurality of semiconductor memories are packaged, the same electrical characteristics as that of one unit can be provided. Therefore, even if the length of wiring of an interface bus with the terminal unit is increased, its electrical characteristics are not degraded, with the result that a memory card with large capacity and high reliability can be obtained.

2) Analog switches of the above unidirectional and bidirectional buffers are connected to the terminal signal of the semiconductor memory in series and connected to the ground in parallel. A series connected transistor is provided between the power supply input and the internal power supply. A supply voltage detecting circuit is provided, which has as an input the card insertion and extraction signal generated from the card insertion and extraction signal generator on the terminal side, the card insertion and extraction switch in the memory card, or the shortest contact of the parts connected to the terminal unit and an input of the supply voltage for generating an output signal which turns the series transistor and the unidirectional and bidirectional buffers ON or OFF. As a result, even if the card is inserted or extracted when the terminal is in the active state, the stored data is not destroyed and all of the terminal signals of the semiconductor memory are reliably cut off from the terminal unit and are in the low impedance state at the moment the card is inserted or extracted. Thus, resistance to static electricity and an electromagnetic field is increased and resistance to noise can be greatly improved. In addition, when there is no power supply input, battery current is prevented from flowing into the terminal unit.

Although the present invention has been described and illustrated in detail, it is clearly understood that the same is by way of illustration and example only and is not to be taken by way of limitation, the scope of the present invention being limited only by the terms of the appended claims.

What is claimed is:

1. A memory card circuit for a portable memory card selectably insertable in and extractable from a terminal unit thereby respectively connecting and disconnecting the circuit from the terminal unit for reading information from and writing information into the memory card circuit comprising:

a memory for storing data;

an internal power supply for applying a voltage to the memory to retain stored data when the circuit is not connected to the terminal unit;

a power input terminal for supplying power to said circuit from a terminal unit when the circuit is connected to a terminal unit;

a data input terminal for supplying data to the memory;

a data output terminal for receiving data from the memory;

a unidirectional non-inverting buffer connected between said data input terminal and said memory and including a first non-inverting buffer amplifier, connected between said data input terminal and said memory, a first analog switch connected between said data input terminal and said non-inverting buffer amplifier and a second analog switch connected between said non-inverting buffer amplifier and ground;

a bidirectional three-state buffer connected between said memory and said data output terminal including second and third oppositely directed, parallel connected buffer amplifiers connected between said memory and said data output terminal, a third analog switch connected between said data output terminal and said second and third buffer amplifiers and fourth and fifth analog switches connected respectively between said memory and ground and said data output terminal and ground;

a power switch connected in series between said power input terminal and said internal power supply; and a supply voltage detecting circuit receiving a card insertion and extraction signal indicative of the connection with and disconnection from a terminal unit of the circuit and the voltage of said internal power supply for generating an output signal for opening and closing the power switch and for actuating said unidirectional non-inverting buffer and said bidirectional three-state buffer.

2. The circuit of claim 1 wherein said power switch is a transistor.

3. The circuit of claim 1 including means for generating the card insertion and extraction signal.

4. The circuit of claim 3 wherein said means for generating the card insertion and extraction signal is disposed within the terminal unit and comprises a switch actuated during connection of said circuit with and disconnection of said circuit from the terminal unit.

5. The circuit of claim 3 wherein said means for generating the card insertion and extraction signal is disposed within a card containing said circuit and comprises a voltage divider connected between said power input terminal and ground, said supply voltage detecting circuit and a switch actuated during connection of said circuit with and disconnection of said circuit from the terminal unit being connected to said voltage divider.

6. The circuit of claim 3 including a card in which said circuit is mounted, said card including a plurality of pins for making electrical connection with a complementary connector of the terminal unit wherein a pin for receiving the card insertion and extraction signal is arranged to connect to the terminal unit after all other of said pins have been connected during insertion of the card and to disconnect from the terminal unit during extraction of the card from the terminal unit before any other of said pins have been disconnected.

* * * * *